United States Patent
Lin

(10) Patent No.: US 10,153,252 B2
(45) Date of Patent: Dec. 11, 2018

(54) WAFER TO WAFER STRUCTURE AND METHOD OF FABRICATING THE SAME

(71) Applicant: UNITED MICROELECTRONICS CORP., Hsin-Chu (TW)

(72) Inventor: Ming-Tse Lin, Hsinchu (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/269,994

(22) Filed: Sep. 20, 2016

(65) Prior Publication Data

US 2017/0117255 A1  Apr. 27, 2017

Related U.S. Application Data

(62) Division of application No. 14/945,410, filed on Nov. 18, 2015, now Pat. No. 9,478,496.

(30) Foreign Application Priority Data

Oct. 26, 2015  (CN) .......................... 2015 1 0699989

(51) Int. Cl.
   *H01L 25/065*    (2006.01)
   *H01L 23/00*     (2006.01)
   *H01L 21/768*    (2006.01)
   *H01L 21/20*     (2006.01)
   *H01L 25/00*     (2006.01)
   *H01L 21/18*     (2006.01)
   *H01L 23/48*     (2006.01)

(52) U.S. Cl.
   CPC ........ *H01L 25/0657* (2013.01); *H01L 21/187* (2013.01); *H01L 21/2007* (2013.01); *H01L 21/76898* (2013.01); *H01L 23/481* (2013.01); *H01L 24/24* (2013.01); *H01L 24/83* (2013.01); *H01L 25/50* (2013.01); *H01L 24/80* (2013.01); *H01L 24/94* (2013.01); *H01L 2224/24105* (2013.01); *H01L 2224/24147* (2013.01); *H01L 2224/80097* (2013.01); *H01L 2224/80896* (2013.01); *H01L 2224/83896* (2013.01); *H01L 2224/9205* (2013.01); *H01L 2224/9212* (2013.01); *H01L 2224/94* (2013.01); *H01L 2225/06524* (2013.01); *H01L 2225/06544* (2013.01)

(58) Field of Classification Search
   None
   See application file for complete search history.

(56) References Cited

U.S. PATENT DOCUMENTS 7,153,756 B1  12/2006  Houston
8,030,208 B2  10/2011  Leung
(Continued)

*Primary Examiner* — Alexander Ghyka
(74) *Attorney, Agent, or Firm* — Winston Hsu

(57) ABSTRACT

A wafer to wafer structure includes a first wafer, a second wafer. A first bonding layer and a second bonding layer are disposed between the first wafer and the second wafer. A plurality of first interconnects are disposed within the he first bonding layer. A plurality of second interconnects are disposed within the second bonding layer. An interface is disposed between the first bonding layer and the second bonding layer. At least a through silicon via penetrates the first wafer, the first bonding layer and the interface to enter the second bonding layer. The through silicon via contacts one of the first interconnects and one of the second interconnects.

13 Claims, 4 Drawing Sheets

(56) References Cited

U.S. PATENT DOCUMENTS

| | | |
|---|---|---|
| 8,518,741 B1 | 8/2013 | Lu |
| 2007/0158787 A1 | 7/2007 | Chanchani |
| 2012/0146193 A1 | 6/2012 | Stuber |
| 2012/0168935 A1 | 7/2012 | Huang |
| 2012/0289062 A1* | 11/2012 | Lo ................. H01L 21/6835 438/782 |
| 2013/0277844 A1 | 10/2013 | Chiou |
| 2013/0307143 A1 | 11/2013 | Lin |
| 2013/0307160 A1 | 11/2013 | Farooq |
| 2014/0138847 A1* | 5/2014 | Jeon ............... H01L 21/76898 257/774 |
| 2014/0147972 A1* | 5/2014 | Semmelmeyer .... H01L 25/0652 438/109 |
| 2014/0356981 A1 | 12/2014 | Hubbard |
| 2015/0035554 A1 | 2/2015 | Dang |
| 2015/0072450 A1 | 3/2015 | El-Ghoroury |
| 2015/0251396 A1 | 9/2015 | George |
| 2016/0204084 A1 | 7/2016 | Lin |

* cited by examiner

WAFER TO WAFER STRUCTURE AND METHOD OF FABRICATING THE SAME

CROSS REFERENCE TO RELATED APPLICATIONS

This patent application is a divisional application of and claims priority to U.S. patent application Ser. No. 14/945,410, filed on Nov. 18, 2015, and entitled "WAFER TO WAFER STRUCTURE AND METHOD OF FABRICATING THE SAME" the entire contents of which are incorporated herein by reference.

BACKGROUND OF THE INVENTION

1. Field of the Invention

The present invention relates to a wafer to wafer structure and method of fabricating the same, and more particularly to a method and structure of coupling interconnects on different wafers using through silicon vias.

2. Description of the Prior Art

With increased requirements for chip density and smaller packaging form factors, advances have been made in three-dimensional integration of circuits. In this technology, devices are stacked, and bonded in the vertical direction. Typically, the stacked devices are electrically coupled by electrical contact pads on the devices.

A current flip-chip technique uses a direct electrical connection of face-down electronic components onto substrates, circuit boards, carriers or the like by means of conductive bumps on the chip bond pads. The flip-chip technique has a drawback in that the production efficiency is poor in terms of process complexity and product cost because it requires conventional solder-using complex connection processes. These are solder flux coating, chip/board arranging, solder bump ref lowing, flux removing, and curing processes.

It is desirable to have a novel method of fabricating stacked devices which involves easier processes.

SUMMARY OF THE INVENTION

According to a preferred embodiment of the present invention, a method of fabricating a wafer to wafer structure includes providing a first wafer covered by a first bonding layer, and a second wafer covered by a second bonding layer, wherein the first bonding layer comprises a plurality of first interconnects, and the second bonding layer comprises a plurality of second interconnects. The first bonding layer is mounted to the second bonding layer and an interface is disposed between the first bonding layer and the second bonding layer. Then, the first wafer is thinned. Finally, at least one through silicon via is formed to contact an interconnect of the first interconnects and an interconnect of the second interconnects.

According to another preferred embodiment of the present invention, a wafer to wafer structure includes a first wafer, a second wafer, a first bonding layer and a second bonding layer disposed between the first wafer and the second wafer, wherein the first bonding layer contacts the second bonding layer, an interface is disposed between the first bonding layer and the second bonding layer, a plurality of first interconnects are disposed within the first bonding layer, a plurality of second interconnects are disposed within the second bonding layer. At least one through silicon via penetrates the first wafer, the first bonding layer and the interface, and enters the second bonding layer, wherein the through silicon via contacts an interconnect of the first interconnects and an interconnect of the second interconnects.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
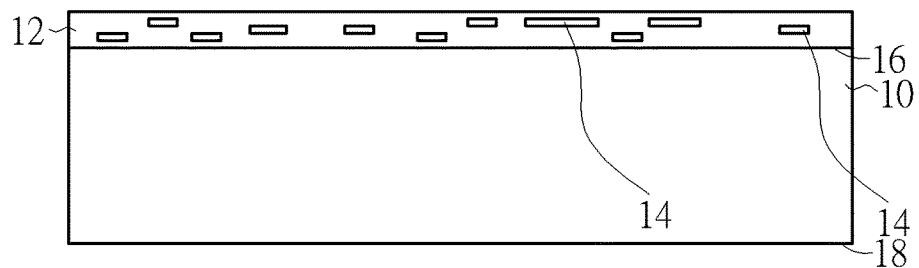
FIG. 1 depicts a stage of providing a first wafer and a second wafer.
Figure 1:
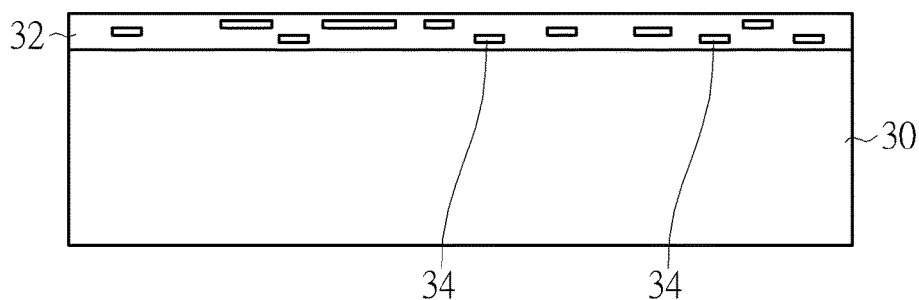

FIG. 1 to FIG. 4 depict a method of fabricating a wafer to wafer structure according to a first preferred embodiment of the present invention. As shown in FIG. 1, a first wafer 10 and a second wafer 30 are provided. A first bonding layer 12 covers the first wafer 10. The second bonding layer 32 covers the second wafer 30. Numerous first interconnects 14 are disposed within the first bonding layer 12 and numerous second interconnects 34 are disposed within the second bonding layer 32. The first wafer 10 and the second wafer 30 can independently include any semiconductor material, for example, Si, Ge, SiGe, SiC, SiGeC, Ga, GaAs, InAs or InP. Moreover, the first wafer 10 and the second wafer 30 may be doped, undoped or comprise both doped and undoped regions. The first wafer 10 may include at least one through silicon via (TSV) made by a TSV-first process. Similarity, the second wafer 30 may include at least one through silicon via made by a TSV-first process. The first bonding layer 12 and the second bonding layer 32 may independently include oxide, nitrogen-oxide, nitride or a combination thereof. The first interconnects 14 and the second interconnects 34 may independently include Al, Cu or other metals. The method of fabricating the first interconnects 14 in the first bonding layer 12, and the second interconnects 34 in the second bonding layer 32 may include etching the first bonding layer 12 and the second bonding layer 32 to form openings followed by depositing metals into the openings. Alternatively, the metals may be formed in advance then patterned, followed by forming the first bonding layer 12 and the second bonding layer 32 to cover the patterned metals. The steps of fabricating the first interconnects 14 and the second interconnects 34 may or may not be simultaneous. The first interconnects 14 may be formed before the second interconnects 34 or vice versa. Moreover, the first wafer 10 includes a front side 16 and a back side 18. The back side 18 is opposite the front side 16. The first bonding layer 12 covers and contacts the front side 16.

Figure 2:
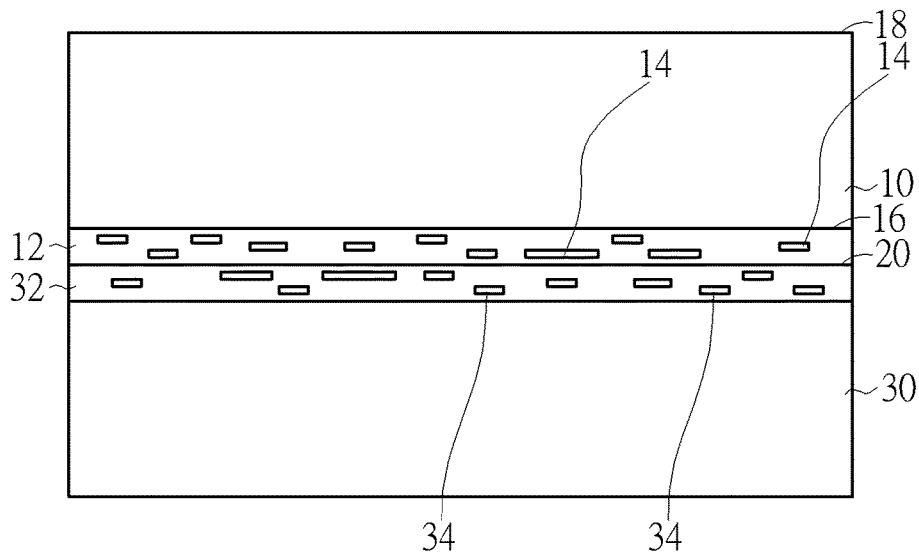
FIG. 2 depicts a stage of mounting a first bonding layer to a second bonding layer.

As shown in FIG. 2, the first bonding layer 12 is mounted on the second bonding layer 32. The first bonding layer 12 contacts the second bonding layer 32. The first bonding layer 12 is generally mounted on the second bonding layer 32 by an oxide fusion bonding process. In detail, the oxide fusion bonding process may include contacting and aligning the first bonding layer 12 to the second bonding layer 32 at room temperature. Then, the first bonding layer 12 and the second bonding layer 32 undergo a thermal anneal process at a temperature between 600 and 1200° C. for several hours to make the contact surface of the first bonding layer 12 and the second bonding layer 32 form chemical bonds to thereby complete the mounting. After the thermal anneal process, an interface is disposed between the first bonding layer 12 and the second bonding layer 32, wherein the interface is defined as a contact surface having chemical bonds between the first bonding layer 12 and the second bonding layer 32.

Figure 3:
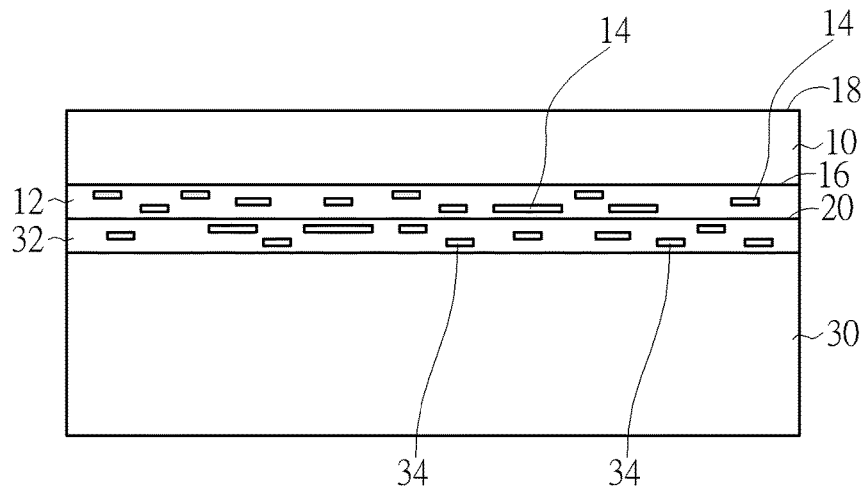
FIG. 3 depicts a stage of thinning the back side of the first wafer.
Figure 4:
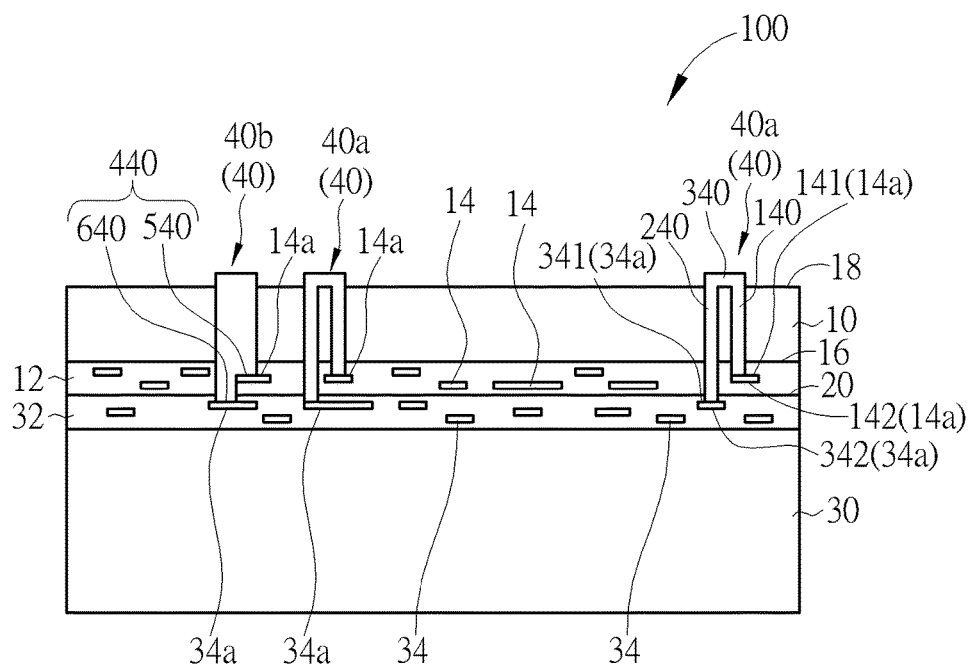
FIG. 4 depicts a stage of forming through silicon vias.

As shown in FIG. 3, the back side 18 of the first wafer 10 is thinned. As shown in FIG. 4, at least one through silicon via 40 is formed to penetrate the first wafer 10 from the back side 18, and penetrate the first bonding layer 12 and the interface 20. The through silicon via 40 enters the second bonding layer 32. The through silicon via 40 contacts an interconnect 14a of the first interconnects 14 and an interconnect 34a of the second interconnects 34. The interconnect 14a has a first surface 141 and a second surface 142. The first surface 141 is opposite to the second surface 142. The interconnect 34a has a first surface 341 and a second surface 342. The first surface 341 is opposite to the second surface 342. The second surface 142 of the interconnect 14a is closer/adjacent to the second surface 342 of interconnect 34a. The first surface 141 of interconnect 14a is further away from the second surface 342 of interconnect 34a. The through silicon via 40 is directly contacting the first surface 141 of the first interconnect 14a. The through silicon via 40 is free from contacting the second surface 142. The through silicon via 40 directly contacts the first surface 341 of the interconnect 34a, but is free from contacting the second surface 342 of the interconnect 34a. The through silicon via 40 may have two different types such as the through silicon via 40a and the through silicon via 40b. A suitable type of the through silicon via 40 can be decided based on different product requirements. As shown in FIG. 4, the through silicon via 40a includes a first sub via 140, a second sub via 240 and a bridge 340, the first sub via 140 contacts the interconnect 14a of the first interconnects 14, the second sub via 240 contacts the interconnect 34a of the second interconnects 34, and the bridge 340 is disposed on the back side 18 of the first wafer 10 and contacts the first sub via 140 and the second sub via 240. In detail, the first sub via 140 penetrates the first wafer 10 and enters the first bonding layer 12, but the first sub via 140 does not penetrate the interface 20. The second sub via 240 penetrates the first wafer 10, the first bonding layer 12 and the interface 20 to enter the second bonding layer 32. The second sub via 240 does not enter the second wafer 30. The steps of fabricating the first sub via 140 and the second sub via 240 include etching the first wafer 10 to form two openings penetrating the first wafer 10 and entering the first bonding layer 12, wherein one of the openings takes the interconnect 14a as an etching stop layer and will become the first sub via 140 later. Meanwhile, another opening (which will become the second sub via 240 later) continues to penetrate the first bonding layer 12, the interface 20, enter the second bonding layer 32 and take the interconnect 34a as an etching stop layer. After that, two openings are filled with a metal layer, and the metal layer is also formed on the back side 18 of the first wafer 10. Then, the metal layer on the back side 18 of the first wafer 10 is patterned to form the bridge 340. Besides forming the bridge 340, the patterned metal layer on the back side 18 can also serve as a redistribution layer.

A bottom of the through silicon via 40b has a step profile 440. The step profile 440 comprises a first plane surface 540 and a second plane surface 640, wherein the first plane surface 540 has a different height from that of the second plane surface 640. Preferably, the first plane surface 540 is higher than the second plane surface 640, but is not limited thereto. The first plane surface 540 contacts the interconnect 14a of the first interconnects 14, and the second plane surface 640 contacts the interconnect 34a of the second interconnects 34. The steps of fabricating the through silicon via 40b include etching the first wafer 10 to form an opening penetrating the first wafer 10 and entering the first bonding layer 12. In the bonding layer 12, part of the opening takes the interconnect 14a as an etching stop layer, and the remaining part of the opening which is not stopped by the interconnect 14a continues to penetrate the interface 20, enter the second bonding layer 34 and stop on the interconnect 34a. In other words, the interconnect 34a serves as an etching stop layer for part of the opening. Later, a metal layer fills the opening and is formed on the back side 18 of the first wafer 10. Then, the metal layer on the back side 18 is patterned to form the through silicon via 40b. The through silicon via 40b does not enter the second wafer 30. The through silicon via 40a and the through silicon via 40b can be fabricated in the same step.

At this point, the interconnect 14a of the first interconnect 14 electrically connects to the interconnect 34a of the second interconnect 34 through the through silicon via 40a or the through silicon via 40b. A wafer to wafer structure 100 of the present invention is completed.

Figure 5:
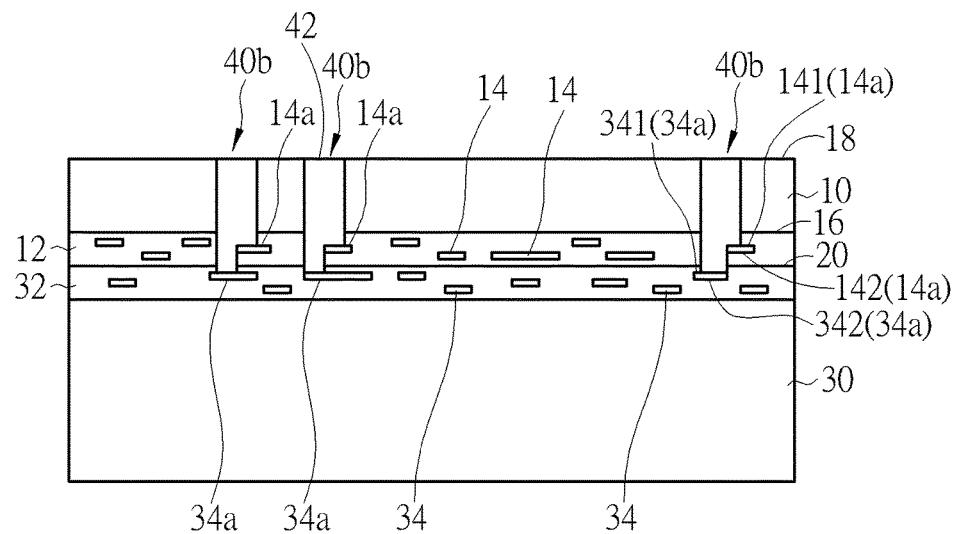
FIG. 5 shows a variation of a wafer to wafer structure fabricated by the method of the first preferred embodiment of the present invention.

Although there are two through silicon vias 40a and one through silicon via 40b in the wafer to wafer structure 100, the number of through silicon vias 40a and through silicon vias 40b can be changed based on different requirements. For example, a wafer to wafer structure can utilize only the through silicon via 40a to electrically connect the first interconnect 14 and the second interconnect 34 without using the through silicon via 40b. In an alternative embodiment, as shown in FIG. 5, a wafer to wafer structure can utilize the through silicon via 40b to electrically connect the first interconnect 14 and the second interconnect 34 without using the through silicon via 40a. Similarly to FIG. 4, the through silicon via 40b in FIG. 5 is directly contacting the first surface 141 of the first interconnect 14a, but is free from contacting the second surface 142. If the wafer to wafer structure does not need a redistribution layer at the back side 18, after the metal layer fills the opening, the metal layer on the back side 18 can be removed entirely by a chemical mechanical polish process, or other suitable process. After that, a surface 42 of the through silicon via 40b aligns with the back side 18 of the first wafer 10.

Figure 6:
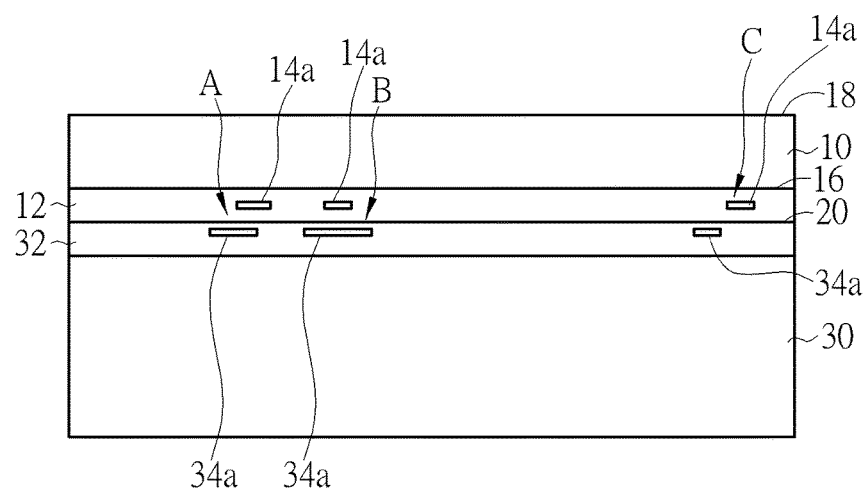
FIG. 6 depicts relative positions of interconnects.

It is noteworthy that the interconnect 14a and the interconnect 34a have specific relative positions, because the interconnect 14a and the interconnect 34a serve as etching stop layers when fabricating the through silicon via 40a and the through silicon via 40b. FIG. 6 depicts relative positions of the interconnect 14a and the interconnect 34a. For the sake of clarity, only the first wafer, 10, the second wafer 30, the interconnect 14a, the interconnect 34a, the first wafer 10, the second wafer 30, the first bonding layer 12, the interface 20 and the second bonding layer 32 are shown. There are three types of relative positions of the interconnect 14a and the interconnect 34a, which are designated here as type A, type B and type C, and shown in FIG. 6.

In relative position type A, the interconnect 14a and the interconnect 34a only partly overlap each other. In type B, the interconnect 34a entirely overlaps the interconnect 14a, and the interconnect 34a is larger than the interconnect 14a in the horizontal direction. In type C, the interconnect 14a and the interconnect 34a do not overlap each other. Type C is preferably used for the through silicon via 40a. Furthermore, there is no other metal disposed between the interconnect 14a and the interconnect 34a in type A, type B and type C. In this way, the interconnect 14a and the interconnect 34a can be the etching stop layer when fabricating the through silicon via 40.

Figure 7:
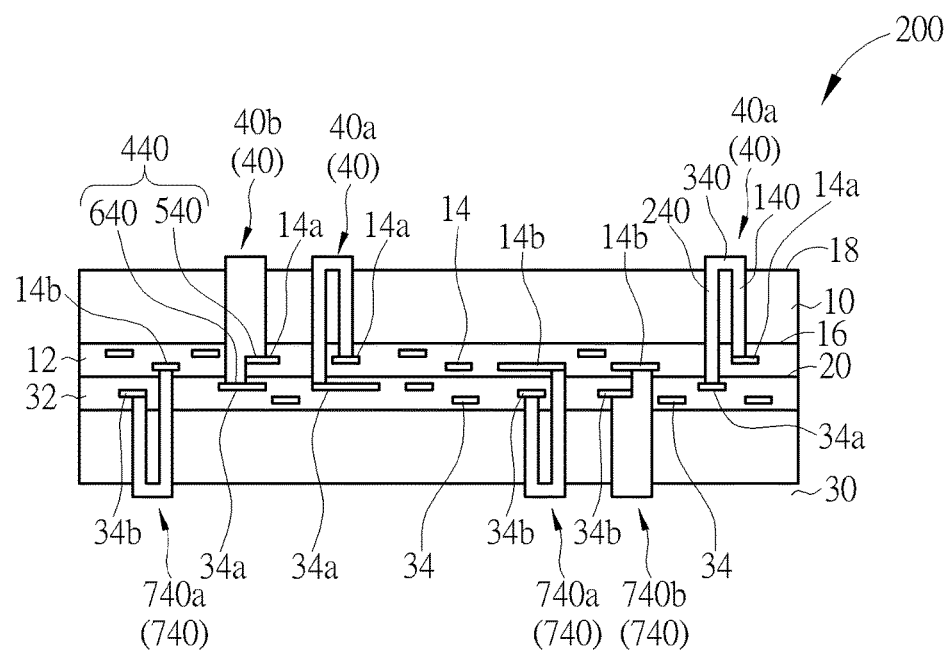
FIG. 7 shows another variation of a wafer to wafer structure fabricated by the method of the first preferred embodiment of the present invention.

As shown in FIG. 7, the second wafer 30 can undergo the same processes illustrated in FIG. 1 to FIG. 5. The second wafer 30 can be thinned first. Then, a through silicon via 740 can be formed to penetrate the second wafer 30, the second bonding layer 32 and the interface 20, and enter the first bonding layer 12. At this point, a wafer to wafer structure with through silicon vias at two sides 200 is completed. The through silicon via 740 contacts an interconnect 14b of the first interconnects 14 and an interconnect 34b of the second interconnects 34. Similar to the through silicon via 40, the through silicon via 740 may also have two different types such as a through silicon via 740a and a through silicon via 740b. The structure of the through silicon via 740a is the same as the through silicon via 40a, and the through silicon via 740b is the same as the through silicon via 40b. The detailed description is therefore not repeated.

Figure 8:
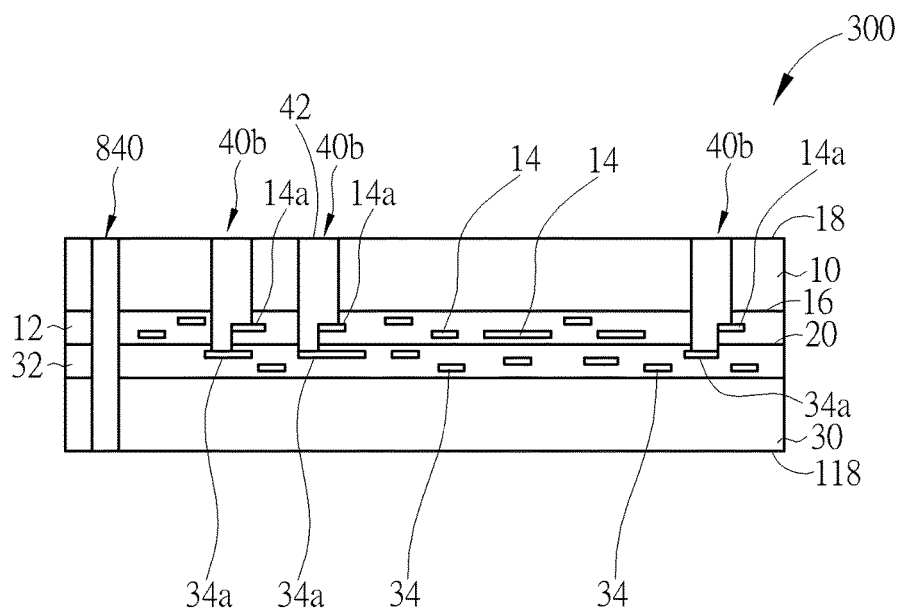
FIG. 8 shows yet another variation of a wafer to wafer structure fabricated by the method of the first preferred embodiment of the present invention.

As shown in FIG. 8, after the wafer to wafer structure 100 is completed, a through silicon via 840 can be formed to penetrate the first wafer 10, the first bonding layer 12, the interface 20, the second bonding layer 32 and the second wafer 30 to align one end of the through silicon via 840 with the back side 18 of the first wafer 30. Furthermore, the other end of the through silicon via 840 is aligned with a back side 118 of the second wafer. At this point, a wafer to wafer structure 300 is completed.

FIG. 4 shows a wafer to wafer structure fabricated by the method illustrated in FIG. 1 to FIG. 4, wherein like reference numerals are used to refer to like elements throughout. A wafer to wafer structure 100 includes a first wafer 10 and a second wafer 30. A first bonding layer 12 and a second bonding layer 32 are disposed between the first wafer 10 and the second wafer 30, wherein the first bonding layer 12 contacts the second bonding layer 32. An interface 20 is disposed between the first bonding layer 12 and the second bonding layer 32. A plurality of first interconnects 14 are disposed within the first bonding layer 12. A plurality of second interconnects 34 are disposed within the second bonding layer 32. At least one through silicon via 40 penetrates the first wafer 10, the first bonding layer 12 and the interface 20, and enters the second bonding layer 32, wherein the through silicon via 40 contacts an interconnect 14a of the first interconnects 14 and an interconnect 34a of the second interconnects 34. The first wafer 10 comprises a front side 16 and a back side 18, the front side 16 is covered and contacted by the first bonding layer 12, and the back side 18 is opposite the front side 16. The through silicon via 40 may have two different types such as the through silicon via 40a and the through silicon via 40b. Suitable types of the through silicon via 40 can be decided based on different product requirements. The through silicon via 40a includes a first sub via 140, a second sub via 240 and a bridge 340. The through silicon via 40a includes a first sub via 140, a second sub via 240 and a bridge 340, the first sub via 140 contacts the interconnect 14a of the first interconnects 14, the second sub via 240 contacts the interconnect 34a of the second interconnects 34, and the bridge 340 is disposed on the back side 18 of the first wafer 10 and contacts the first sub via 140 and the second sub via 240. The first sub via 140 penetrates the first wafer 10 and enters the first bonding layer 12, but the first sub via 140 does not penetrate the interface 20. The second sub via 240 penetrates the first wafer 10, the first bonding layer 120 and the interface 20 to enter the second bonding layer 32. The second sub via 240 does not enter the second wafer 30. Moreover, a bottom of the through silicon via 40b has a step profile 440. The step profile 440 comprises a first plane surface 540 and a second plane surface 640, wherein the first plane surface 540 has a different height from that of the second plane surface 640. Preferably, the first plane surface 540 is higher than the second plane surface 640, but is not limited thereto. The first plane surface 540 contacts the interconnect 14a of the first interconnects 14, and the second plane surface 640 contacts the interconnect 34a of the second interconnects 34. The through silicon via 40b does not enter the second wafer 30.

As shown in FIG. 6, there are three types of relative positions of the interconnect 14a and the interconnect 34a, designated as type A, type B and type C. in type A, the interconnect 14a and the interconnect 34a only partly overlap each other. In type B, the interconnect 34a entirely overlaps the interconnect 14a, and the interconnect 34a is larger than the interconnect 14a in the horizontal direction. In type C, the interconnect 14a and the interconnect 34a do not overlap each other.

The wafer to wafer structures 100/200/300 of the present invention do not need bumps to electrically connect the first interconnects 14 to the second interconnect 34. Therefore, the fabricating steps do not need to include steps for making the bumps. Moreover, the first bonding layer 12 and the second bonding layer 32 are mounted together by the oxide fusion bonding process, and there is no bump on the first bonding layer 12 and the second bonding layer 32. Therefore, the contact surface between the first bonding layer 12 and the second bonding layer 32 is flat, and the mounting of the first bonding layer 12 and the second bonding layer 32 can be performed effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a wafer to wafer structure, comprising:
   providing a first wafer covered by a first bonding layer, and a second wafer covered by a second bonding layer, wherein the first bonding layer comprises a plurality of first interconnects, and the second bonding layer comprises a plurality of second interconnects;
   mounting the first bonding layer and the second bonding layer and an interface being disposed between the first bonding layer and the second bonding layer;
   thinning the first wafer; and
   forming a through silicon via contacting an interconnect of the first interconnects and an interconnect of the second interconnects, wherein the through silicon via is free from penetrating the interconnect of the first interconnects and the interconnect of the second interconnects, and wherein the through silicon via penetrates an entire thickness of the thinned-down first wafer, the interconnect of the first interconnects comprises a first surface and a second surface, the first surface is opposite to the second surface, and the through silicon via directly contacts the first surface, but is free from contacting the second surface.

2. The method of fabricating a wafer to wafer structure of claim 1, wherein the through silicon via penetrates the first wafer, the first bonding layer and the interface, and the through silicon via enters the second bonding layer.

3. The method of fabricating a wafer to wafer structure of claim 1, wherein the first wafer comprises a front side and a back side, the front side is covered and contacted by the first bonding layer, and the back side is opposite the front side.

4. The method of fabricating a wafer to wafer structure of claim 3, wherein the through silicon via comprises a first sub via, a second sub via and a bridge, the first sub via contacts the interconnect of the first interconnects, the second sub via contacts the interconnect of the second interconnects, and the bridge is disposed on the back side and contacts the first sub via and the second sub via.

5. The method of fabricating a wafer to wafer structure of claim 4, wherein the first sub via penetrates the first wafer and enters the first bonding layer, and the first sub via does not penetrate the interface.

6. The method of fabricating a wafer to wafer structure of claim 4, wherein the second sub via penetrates the first wafer, the first bonding layer and the interface to enter the second bonding layer.

7. The method of fabricating a wafer to wafer structure of claim 1, wherein a bottom of the through silicon via comprises a step profile, the step profile comprises a first plane surface and a second plane surface, the first plane surface has a different height from that of the second plane surface, the first plane surface contacts the interconnect of the first interconnects, and the second plane surface contacts the interconnect of the second interconnects.

8. The method of fabricating a wafer to wafer structure of claim 1, wherein the interconnect of the first interconnects directly contacting the through silicon via and the interconnect of the second interconnects directly contacting the through silicon via do not overlap each other.

9. The method of fabricating a wafer to wafer structure of claim 1, wherein the interconnect of the first interconnects directly contacting the through silicon via and the interconnect of the second interconnects directly contacting the through silicon via only partly overlap each other.

10. The method of fabricating a wafer to wafer structure of claim 1, wherein the interconnect of the second interconnects entirely overlaps the interconnect of the first interconnects, and the interconnect of the second interconnects is larger than the interconnect of the first interconnects in a horizontal direction.

11. A method of fabricating a wafer to wafer structure, comprising:
providing a first wafer covered by a first bonding layer, and a second wafer covered by a second bonding layer, wherein the first bonding layer comprises a plurality of first interconnects, and the second bonding layer comprises a plurality of second interconnects;
mounting the first bonding layer and the second bonding layer and an interface being disposed between the first bonding layer and the second bonding layer;
thinning the first wafer; and
forming a through silicon via contacting an interconnect of the first interconnects and an interconnect of the second interconnects, wherein the through silicon via does not penetrate the interconnect of the first interconnects, wherein a first surface of the through silicon via directly contacts the interconnect of the first interconnects, a second surface of the through silicon via directly contacts the interconnect of the second interconnects, the first surface does not overlap the second surface, the first surface is parallel to the second surface, and the interconnect of the first interconnects is disposed within the first bonding layer covering the first wafer, which is thinned down.

12. The method of fabricating a wafer to wafer structure of claim 1, wherein the interconnect of the second interconnects comprises a third surface and a fourth surface, the third surface is opposite to the fourth surface, and wherein the through silicon via directly contacts the third surface, and the through silicon via is free from contacting the fourth surface.

13. A method of fabricating a wafer to wafer structure, comprising:
providing a first wafer covered by a first bonding layer, and a second wafer covered by a second bonding layer, wherein the first bonding layer comprises a plurality of first interconnects, and the second bonding layer comprises a plurality of second interconnects;
mounting the first bonding layer and the second bonding layer and an interface being disposed between the first bonding layer and the second bonding layer;
thinning the first wafer; and
forming a through silicon via contacting an interconnect of the first interconnects and an interconnect of the second interconnects, wherein the interconnect of the first interconnects directly contacting the through silicon via and the interconnect of the second interconnects directly contacting the through silicon via only partly overlap each other, wherein the through silicon via does not penetrate the interconnect of the first interconnects, and wherein the through silicon via penetrates an entire thickness of the thinned-down first wafer, and the through silicon via directly contacts a first surface of the interconnect of the first interconnects, but the through silicon via is free from contacting a second surface of the first interconnects, and the second surface is opposite to the first surface.

* * * * *